(12) United States Patent
Konopka

(10) Patent No.: US 10,088,955 B2
(45) Date of Patent: Oct. 2, 2018

(54) METHOD OF DYNAMICALLY SHIELDING A CAPACITIVE TOUCH SYSTEM AGAINST INTERFERENCE CAUSED BY NEAR FIELD COMMUNICATION RADIO FREQUENCY EMISSION

(71) Applicant: CIRQUE CORPORATION, Salt Lake City, UT (US)

(72) Inventor: Joshua Konopka, Salt Lake City, UT (US)

(73) Assignee: CIRQUE CORPORATION, Salt Lake City, UT (US)

( * ) Notice: Subject to any disclaimer, the term of this patent is extended or adjusted under 35 U.S.C. 154(b) by 109 days.

(21) Appl. No.: 15/442,928

(22) Filed: Feb. 27, 2017

(65) Prior Publication Data

US 2017/0249032 A1 Aug. 31, 2017

Related U.S. Application Data

(60) Provisional application No. 62/299,697, filed on Feb. 25, 2016.

(51) Int. Cl.
*G06F 3/041* (2006.01)
*G06F 3/044* (2006.01)
*G06F 3/0488* (2013.01)
*H03K 17/96* (2006.01)

(52) U.S. Cl.
CPC ............ *G06F 3/0418* (2013.01); *G06F 3/041* (2013.01); *G06F 2203/04107* (2013.01); *H03K 2217/960765* (2013.01)

(58) Field of Classification Search
None
See application file for complete search history.

(56) References Cited

U.S. PATENT DOCUMENTS

| | | | |
|---|---|---|---|
| 6,025,816 A | 2/2000 | Dent et al. | |
| 7,306,144 B2 | 12/2007 | Moore | |
| 9,513,756 B1 * | 12/2016 | Mishra | G06F 3/044 |
| 2004/0095336 A1 | 5/2004 | Hong et al. | |
| 2004/0105040 A1 | 6/2004 | Oh et al. | |
| 2004/0155871 A1 | 8/2004 | Perski et al. | |
| 2006/0227114 A1* | 10/2006 | Geaghan | G06F 3/0418 |
| | | | 345/173 |
| 2008/0309623 A1 | 12/2008 | Hotelling et al. | |
| 2010/0188362 A1 | 7/2010 | Mahowald et al. | |
| 2010/0265189 A1 | 10/2010 | Rofougaran | |
| 2011/0012794 A1 | 1/2011 | Schlub et al. | |
| 2012/0044199 A1* | 2/2012 | Karpin | G06F 3/0416 |
| | | | 345/174 |

(Continued)

*Primary Examiner* — Kent Chang
*Assistant Examiner* — Benjamin Morales Fernandez
(74) *Attorney, Agent, or Firm* — Parsons Behle & Latimer

(57) ABSTRACT

A system and method for reducing interference caused by a near field communication antenna that is in close proximity of a touch sensor that the near field communication antenna will cause electromagnetic interference with operation of the touch sensor when the near field communication antenna is transmitting, wherein specific electrodes of the touch sensor are grounded when the near field communication antenna is actively transmitting a signal, thereby enabling the touch sensor to continue operating at the same time as the near field communication antenna.

14 Claims, 3 Drawing Sheets

(56) References Cited

U.S. PATENT DOCUMENTS

| | | | | |
|---|---|---|---|---|
| 2012/0050214 A1* | 3/2012 | Kremin | ................ | G06F 3/0418 |
| | | | | 345/174 |
| 2012/0074961 A1* | 3/2012 | Herrmann | ............... | G06F 3/044 |
| | | | | 324/658 |
| 2015/0248177 A1* | 9/2015 | Maharyta | ................ | G06F 3/044 |
| | | | | 345/174 |
| 2015/0255856 A1* | 9/2015 | Hong | .................... | H01Q 1/243 |
| | | | | 343/702 |

* cited by examiner

METHOD OF DYNAMICALLY SHIELDING A CAPACITIVE TOUCH SYSTEM AGAINST INTERFERENCE CAUSED BY NEAR FIELD COMMUNICATION RADIO FREQUENCY EMISSION

BACKGROUND OF THE INVENTION

Field of the Invention

This invention relates generally to touch sensors that use capacitance sensing technology, and near field communication antenna technology. Specifically, the invention pertains to a system and method that dynamically shields a touch sensor from the electromagnetic signals from a near field antenna that is in close proximity to the touch sensor.

Description of the Prior Art

There are several designs for capacitance sensitive touch sensors which may take advantage of a system and method of the invention. It is useful to examine the underlying technology of the touch sensors to better understand how any capacitance sensitive touchpad can take advantage of the present invention.

The CIRQUE® Corporation touchpad is a mutual capacitance-sensing device and an example is illustrated as a block diagram in FIG. 1. In this touchpad 10, a grid of X (12) and Y (14) electrodes and a sense electrode 16 is used to define the touch-sensitive area 18 of the touchpad. Typically, the touchpad 10 is a rectangular grid of approximately 16 by 12 electrodes, or 8 by 6 electrodes when there are space constraints. Interlaced with these X (12) and Y (14) (or row and column) electrodes is a single sense electrode 16. All position measurements are made through the sense electrode 16.

The CIRQUE® Corporation touchpad 10 measures an imbalance in electrical charge on the sense line 16. When no pointing object is on or in proximity to the touchpad 10, the touchpad circuitry 20 is in a balanced state, and there is no charge imbalance on the sense line 16. When a pointing object creates imbalance because of capacitive coupling when the object approaches or touches a touch surface (the sensing area 18 of the touchpad 10), a change in capacitance occurs on the electrodes 12, 14. What is measured is the change in capacitance, but not the absolute capacitance value on the electrodes 12, 14. The touchpad 10 determines the change in capacitance by measuring the amount of charge that must be injected onto the sense line 16 to reestablish or regain balance of charge on the sense line.

The system above is utilized to determine the position of a finger on or in proximity to a touchpad 10 as follows. This example describes row electrodes 12, and is repeated in the same manner for the column electrodes 14. The values obtained from the row and column electrode measurements determine an intersection which is the centroid of the pointing object on or in proximity to the touchpad 10.

In the first step, a first set of row electrodes 12 are driven with a first signal from P, N generator 22, and a different but adjacent second set of row electrodes are driven with a second signal from the P, N generator. The touchpad circuitry 20 obtains a value from the sense line 16 using a mutual capacitance measuring device 26 that indicates which row electrode is closest to the pointing object. However, the touchpad circuitry 20 under the control of some microcontroller 28 cannot yet determine on which side of the row electrode the pointing object is located, nor can the touchpad circuitry 20 determine just how far the pointing object is located away from the electrode. Thus, the system shifts by one electrode the group of electrodes 12 to be driven. In other words, the electrode on one side of the group is added, while the electrode on the opposite side of the group is no longer driven. The new group is then driven by the P, N generator 22 and a second measurement of the sense line 16 is taken.

From these two measurements, it is possible to determine on which side of the row electrode the pointing object is located, and how far away. Using an equation that compares the magnitude of the two signals measured then performs pointing object position determination.

The sensitivity or resolution of the CIRQUE® Corporation touchpad is much higher than the 16 by 12 grid of row and column electrodes implies. The resolution is typically on the order of 960 counts per inch, or greater. The exact resolution is determined by the sensitivity of the components, the spacing between the electrodes 12, 14 on the same rows and columns, and other factors that are not material to the present invention. The process above is repeated for the Y or column electrodes 14 using a P, N generator 24

Although the CIRQUE® touchpad described above uses a grid of X and Y electrodes 12, 14 and a separate and single sense electrode 16, the sense electrode can function as the X or Y electrodes 12, 14 by using multiplexing.

It should be understood that use of the term "touch sensor" throughout this document may be used interchangeably with "forcepad", "touchpad", "proximity sensor", "touch and proximity sensor", "touch panel" and "touch screen".

BRIEF SUMMARY OF THE INVENTION

In a first embodiment, the present invention is a system and method for reducing interference caused by a near field communication antenna that is in close proximity of a touch sensor that the near field communication antenna will cause electromagnetic interference with operation of the touch sensor when the near field communication antenna is transmitting, wherein specific electrodes of the touch sensor are grounded when the near field communication antenna is actively transmitting a signal, thereby enabling the touch sensor to continue operating at the same time as the near field communication antenna.

These and other objects, features, advantages and alternative aspects of the present invention will become apparent to those skilled in the art from a consideration of the following detailed description taken in combination with the accompanying drawings.

DETAILED DESCRIPTION OF THE INVENTION

Reference will now be made to the drawings in which the various elements of the present invention will be given numerical designations and in which the invention will be discussed so as to enable one skilled in the art to make and use the invention. It is to be understood that the following description is only exemplary of the principles of the present invention, and should not be viewed as narrowing the claims which follow.

Figure 1:
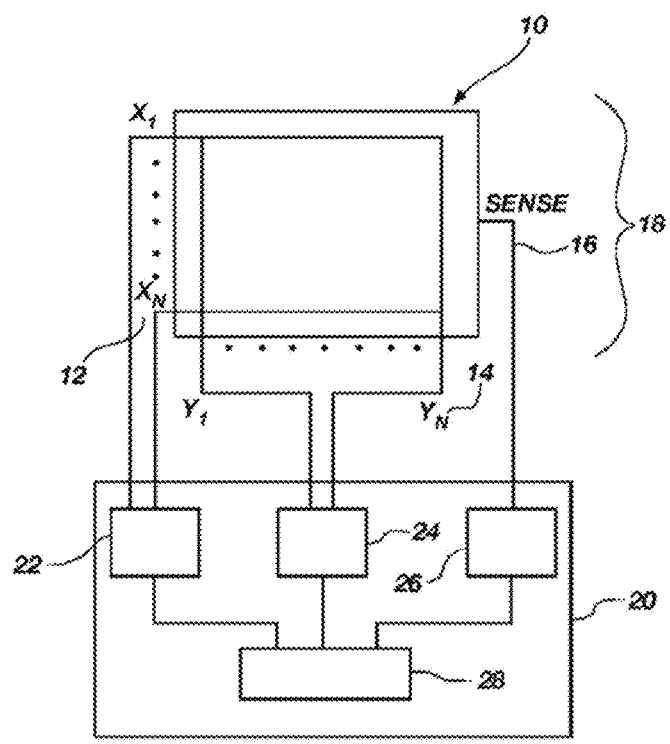
FIG. 1 is a block diagram of operation of a touchpad that is found in the prior art, and which is adaptable for use in the present invention.
Figure 2:
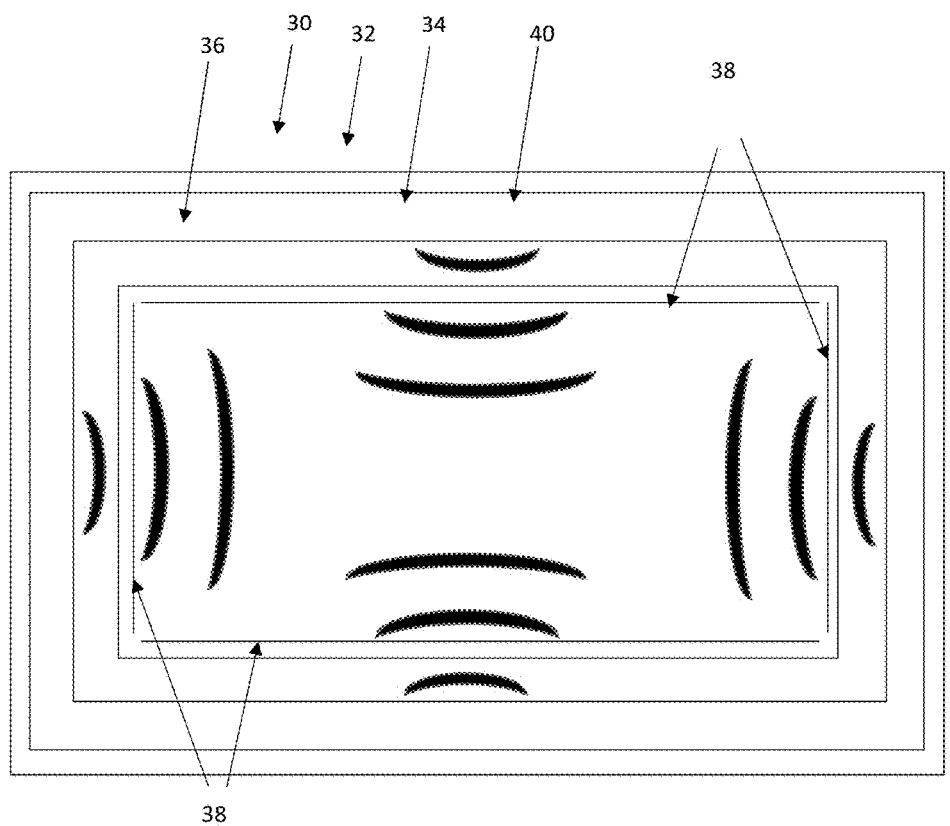
FIG. 2 is a top elevational view of a touch sensor surrounded by a near field communication antenna and causing interference with operation of the touch sensor.

A first embodiment of the present invention begins by illustrating the problem of having an active or transmitting near field communication antenna in close operating proximity of a touch sensor as shown in FIG. 2. A near field communication antenna does not interfere with the touch sensor when in a receiving mode of operation, but when transmitting, the electromagnetic signals generated by the near field communication antenna are far greater in strength than the signals being measured by the touch sensor.

FIG. 2 is a view of the prior art and shows a near field communication antenna 32 surrounding a touch sensor 36 and disposed on a substrate 30. A gap 34 is shown between an outer edge of the touch sensor 36 and the inner edge of the near field communication antenna 32.

It should be understood that the size of the gap 34 may vary substantially depending on the design of the touch sensor 36 and near field communication antenna 32. The gap 34 shown in FIG. 2 is for illustration purposes only. The gap may be larger or substantially non-existent.

When the near field communication antenna 32 is transmitting a signal, there may be electromagnetic interference with the touch sensor because of the strength of the electromagnetic signals being transmitted. The progression of electromagnetic waves is represented in FIG. 2 as wave lines 40. What this means is that when the near field communication antenna 32 is transmitting, the electromagnetic waves from the near field communication antenna will travel toward the center of the touch sensor 36 and cause interference with touch sensor operation.

The first embodiment of the present invention may dynamically shield the touch sensor 36 by utilizing electrodes from the touch sensor itself. In order to implement the first embodiment, the electrodes of the touch sensor 36 may need to be individually addressable in order to control a signal on the outermost or nearly outermost electrodes of the touch sensor. The touch sensor 36 may need to be capable of addressing a single electrode along a top edge, a bottom edge, a right edge and a left edge, or a plurality of electrodes at these four locations that define a perimeter of the touch sensor.

Once the perimeter electrodes 38 at the outer edge of the touch sensor 36 may be controlled by being individually addressed, a specific signal or action may be performed on each perimeter electrode. For example, in the first embodiment, the perimeter electrodes 38 may be grounded by coupling the perimeter electrodes to a ground signal by a touch controller. Therefore, the connection of the perimeter electrodes 38 to ground may be considered to be disposing a signal on the perimeter electrodes. The touch controller (not shown) sends and receives all signals to and from the touch sensor 36.

Grounding the perimeter electrodes 38 may cause the perimeter electrodes to function as a shield by reducing or eliminating the flow of electromagnetic signals past the perimeter electrodes to an inner portion of the touch sensor 36.

In the first embodiment of the invention, the touch sensor 36 may operate in two different modes. In a first mode of operation, all the electrodes of the touch sensor 36 may be used to detect and track touch signals.

Figure 3:
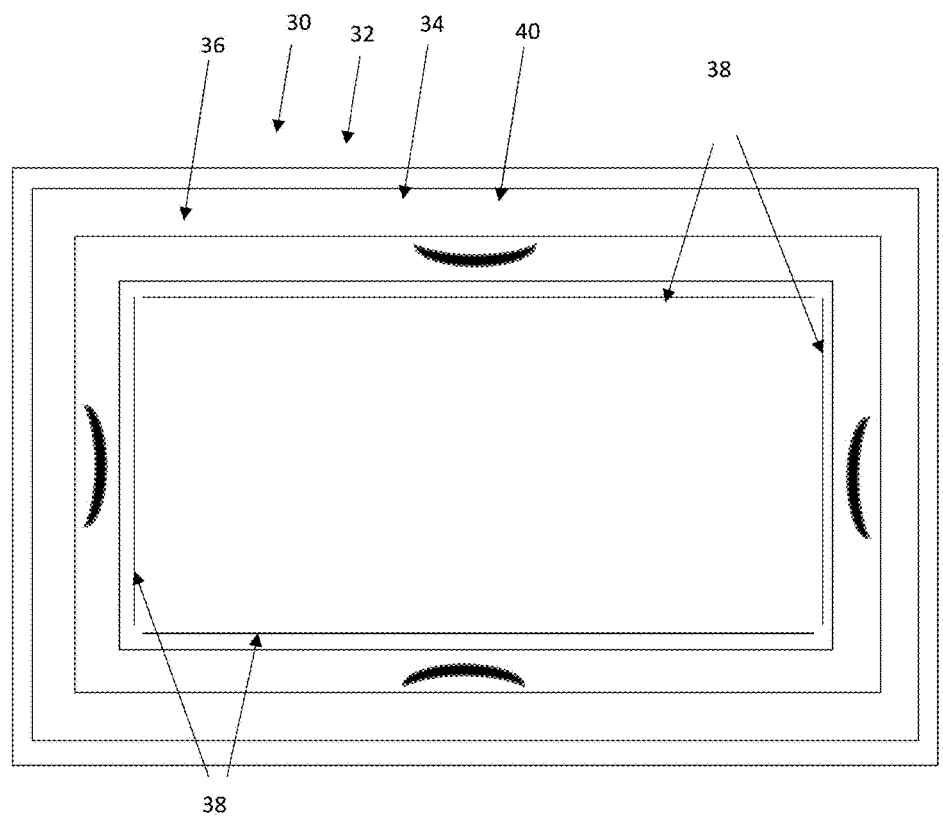
FIG. 3 is a top elevational view of the touch sensor that is providing dynamic shielding to prevent interference by the near field communication antenna.

FIG. 3 is an illustration of a second mode of operation. In the second mode of operation, the perimeter electrodes 38 may be repurposed. Instead of functioning as a touch sensor electrode that receives touch data, the perimeter electrodes are repurposed by being grounded to provide dynamic shielding of the remaining interior electrodes (not shown) of the touch sensor 36. There may be a sufficient number of electrodes remaining when operating in the second mode of operation so that operation of the touch sensor 36 may not be severely impacted by repurposing the perimeter electrodes 38.

The second mode of operation of the touch sensor 36 may be activated in any convenient manner. For example, the near field communication antenna 32 may send a signal to the touch sensor 36 or to the touch controller when the near field communication antenna is going to transmit a signal.

Alternatively, the touch sensor 36 may include circuitry for detection of a signal from the near field communication antenna 32 that may interfere with operation of the touch sensor, and then ground the perimeter electrodes 38.

FIG. 3 shows that the electromagnetic signals 40 from the near field antenna may be substantially blocked from reaching past the perimeter electrodes 38 of the touch sensor 36.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. It is the express intention of the applicant not to invoke 35 U.S.C. § 112, paragraph 6 for any limitations of any of the claims herein, except for those in which the claim expressly uses the words 'means for' together with an associated function.

What is claimed is:

1. A method for reducing interference of a near field communication antenna in close proximity to a touch sensor, said method comprising:
    providing a touch sensor formed from a plurality of electrodes;
    selecting electrodes that are disposed around a perimeter of the touch sensor as perimeter electrodes that are individually addressable in order to send a signal only to the perimeter electrodes, and wherein all remaining electrodes as interior electrodes;
    providing a first mode of operation of the touch sensor wherein the perimeter electrodes and the interior electrodes both operate to receive touch data;
    providing a second mode of operation of the touch sensor wherein the perimeter electrodes receive a signal that shields the interior electrodes so that the interior electrodes receive touch data; and
    operating the touch sensor in the first mode of operation when there is no electromagnetic interference caused by the near field communication antenna, and operating the touch sensor in the second mode of operation when there is electromagnetic interference from the near field communication antenna.

2. The method as defined in claim 1 wherein the method further comprises the step of operating the touch sensor in the second mode of operation when the near field communication antenna is transmitting.

3. The method as defined in claim 1 wherein the method further comprises repurposing the perimeter electrodes when switching the mode of operation of the touch sensor between the first mode and the second mode.

4. The method as defined in claim 1 wherein the method further comprises grounding the perimeter electrodes when the near field communication antenna is transmitting to thereby shield the interior electrodes of the touch sensor.

5. The method as defined in claim 4 wherein the method further comprises grounding the perimeter electrodes when the near field communication antenna is transmitting to thereby reduce the strength of the electromagnetic signals from the near field communication antenna that reach the interior electrodes of the touch sensor.

6. The method as defined in claim 1 wherein the touch sensor changes from the first mode of operation to the second mode of operation when the touch sensor determines that the near field communication antenna is transmitting, and changes back to the first mode of operation when the touch sensor determines that the near field communication antenna has stopped transmitting.

7. The method as defined in claim 1 wherein the touch sensor changes from the first mode of operation to the second mode of operation when the touch sensor receives a signal from the near field communication antenna that it is going to begin transmitting, and changes back to the first mode of operation when the touch sensor receives a signal from the near field communication antenna that it has stopped transmitting.

8. A method for enabling a touch sensor to operate within a range of interference caused by a near field communication antenna, said method comprising:
    providing a touch sensor formed from a plurality of electrodes;
    selecting electrodes that are disposed around a perimeter of the touch sensor as perimeter electrodes that are individually addressable, and wherein all remaining electrodes as interior electrodes;
    providing a first mode of operation of the touch sensor wherein the perimeter electrodes and the interior electrodes both operate to receive touch data;
    providing a second mode of operation of the touch sensor that repurposes the perimeter electrodes to shield the interior electrodes so that the interior electrodes receive touch data; and
    operating the touch sensor in the first mode of operation when there is no electromagnetic interference caused by the near field communication antenna, and operating the touch sensor in the second mode of operation when there is electromagnetic interference from the near field communication antenna.

9. The method as defined in claim 8 wherein the method further comprises operating the touch sensor in the second mode of operation when the near field communication antenna is transmitting.

10. The method as defined in claim 8 wherein the method further comprises repurposing the perimeter electrodes when switching the mode of operation of the touch sensor between the first mode and the second mode.

11. The method as defined in claim 8 wherein the method further comprises grounding the perimeter electrodes when the near field communication antenna is transmitting to thereby shield the interior electrodes of the touch sensor.

12. The method as defined in claim 11 wherein the method further comprises repurposing the perimeter electrodes when the near field communication antenna is transmitting to thereby shield the interior electrodes of the touch sensor from electromagnetic interference.

13. The method as defined in claim 8 wherein the touch sensor changes from the first mode of operation to the second mode of operation when the touch sensor determines that the near field communication antenna is transmitting, and changes back to the first mode of operation when the touch sensor determines that the near field communication antenna has stopped transmitting.

14. The method as defined in claim 8 wherein the touch sensor changes from the first mode of operation to the second mode of operation when the touch sensor receives a signal from the near field communication antenna that it is going to begin transmitting, and changes back to the first mode of operation when the touch sensor receives a signal from the near field communication antenna that it has stopped transmitting.

* * * * *